(12) United States Patent
Galstyan et al.

(10) Patent No.: US 12,125,678 B2
(45) Date of Patent: Oct. 22, 2024

(54) FILTER UNIT, SUBSTRATE TREATING APPARATUS INCLUDING THE SAME, AND SUBSTRATE TREATING METHOD

(71) Applicant: SEMES CO., LTD., Chungcheongnam-do (KR)

(72) Inventors: Ogsen Galstyan, Chungcheongnam-do (KR); Hyo Seong Seong, Gyeongsangnam-do (KR); Byeung Geon Jeon, Seoul (KR); Jong Hwan An, Gyeonggi-do (KR)

(73) Assignee: SEMES CO., LTD. (KR)

( * ) Notice: Subject to any disclaimer, the term of this patent is extended or adjusted under 35 U.S.C. 154(b) by 470 days.

(21) Appl. No.: 16/880,221

(22) Filed: May 21, 2020

(65) Prior Publication Data

US 2020/0373125 A1    Nov. 26, 2020

(30) Foreign Application Priority Data

May 22, 2019    (KR) ........................ 10-2019-0060068

(51) Int. Cl.
*H01J 3/32*      (2006.01)
*H01J 37/32*     (2006.01)
(Continued)

(52) U.S. Cl.
CPC .. *H01J 37/32174* (2013.01); *H01J 37/32724* (2013.01); *H01L 21/6833* (2013.01);
(Continued)

(58) Field of Classification Search
None
See application file for complete search history.

(56) References Cited

U.S. PATENT DOCUMENTS

| 2011/0126765 A1* | 6/2011 | Yamazawa | H01J 37/32091 118/723 MW |
| 2014/0110061 A1* | 4/2014 | Okunishi | H01L 21/67103 156/345.52 |

(Continued)

FOREIGN PATENT DOCUMENTS

| CN | 105047527 A | 11/2015 |
| CN | 107342207 A | 11/2017 |

(Continued)

OTHER PUBLICATIONS

Office Action for related Korean Patent Application No. 10-2019-0060068 mailed Jun. 19, 2020 (10 pages).

(Continued)

*Primary Examiner* — Jeffrie R Lund
*Assistant Examiner* — Tiffany Z Nuckols
(74) *Attorney, Agent, or Firm* — Procopio, Cory, Hargreaves & Savitch, LLP (57) ABSTRACT

A substrate treating apparatus is disclosed. The substrate treating apparatus may include a chamber having a treating space defined therein, a support unit for supporting the substrate in the treating space, a heater power source for applying electric power to a heater in the support unit, a high-frequency power source for applying high-frequency power to a lower electrode in the support unit, and a filter unit installed at a line for connecting the heater power source with the heater to prevent high-frequency inflow. The filter unit may include a housing, one or more coils in the housing, and an adjustment member disposed between the housing and the coil. The adjustment member may be made of a non-magnetic material. The adjustment member may be spaced from the coil at a predefined spacing, and spaced apart from an inner wall of the housing or in contact with the housing inner wall.

12 Claims, 9 Drawing Sheets

(51) Int. Cl.
　　*H01L 21/683*　　(2006.01)
　　*H03H 7/01*　　(2006.01)
　　*H01L 21/67*　　(2006.01)
(52) U.S. Cl.
　　CPC ........ *H03H 7/0115* (2013.01); *H03H 7/0153* (2013.01); *H01J 2237/334* (2013.01); *H01L 21/67069* (2013.01)

(56) References Cited

U.S. PATENT DOCUMENTS

| | | | | |
|---|---|---|---|---|
| 2016/0079038 | A1* | 3/2016 | Okunishi | H01J 37/32798 315/111.21 |
| 2018/0342375 | A1* | 11/2018 | Nguyen | C23C 16/46 |
| 2018/0374672 | A1* | 12/2018 | Hayashi | H01J 37/24 |
| 2020/0126772 | A1* | 4/2020 | Nagashima | H05H 1/46 |

FOREIGN PATENT DOCUMENTS

| | | |
|---|---|---|
| JP | 2003-234293 A | 8/2003 |
| JP | 2005136350 A | 5/2005 |
| JP | 2014-030190 A | 2/2014 |
| KR | 10-2001-0075386 A | 8/2001 |
| KR | 10-2006-0071170 A | 6/2006 |
| KR | 10-2010-0008343 A | 1/2010 |
| KR | 10-2011-0058699 A | 6/2011 |
| KR | 101109063 B1 | 1/2012 |
| KR | 1020160010254 A | 1/2016 |
| KR | 10-1630203 B | 6/2016 |
| KR | 101687566 B1 | 12/2016 |
| KR | 10-2018-0000685 A | 1/2018 |
| KR | 10-2018-0107272 A | 10/2018 |
| KR | 1020190033672 A | 4/2019 |

OTHER PUBLICATIONS

Notice of Allowance for related Korean Patent Application No. 9-5-2021-035951103 mailed May 4, 2021 (6 pages).

* cited by examiner

FILTER UNIT, SUBSTRATE TREATING APPARATUS INCLUDING THE SAME, AND SUBSTRATE TREATING METHOD

CROSS-REFERENCE TO RELATED APPLICATIONS

A claim for priority under 35 U.S.C. § 119 is made to Korean Patent Application No. 10-2019-0060068 filed on May 22, 2019, in the Korean Intellectual Property Office, the entire contents of which are hereby incorporated by reference.

BACKGROUND

Embodiments of the inventive concept described herein relate to a filter unit and a substrate treating apparatus including the same. In addition, embodiments of the inventive concept described herein also relate to a substrate treating method using the filter unit.

In a substrate treating apparatus, an electrostatic chuck may be used to fix a substrate placed on a substrate support in a chamber. When the substrate is placed on the substrate support, a current is supplied to the electrostatic chuck disposed on the substrate support to generate static electricity, and the electrostatic chuck attaches the substrate to the substrate support using such static electricity. In addition, the electrostatic chuck further includes a heater for adjusting a temperature of the substrate during a process. The heater is supplied with an alternating current and generates a heat to maintain the substrate at a constant temperature. In a substrate treating process using plasma, the temperature of the substrate greatly affects plasma formation on the substrate, so that heater control of the electrostatic chuck for maintaining the substrate at an appropriate temperature plays an important role in a productivity of the process.

A conventional electrostatic chuck has a problem in that a noise signal is introduced into an alternating current power source that supplies the alternating current to the heater because of the plasma or an RF bias signal applied to the substrate support to control the plasma. Such noise signal interferes with the precise control of the heater, thereby lowering a plasma control ability of the apparatus in the substrate treating process, thereby lowering the productivity of the process. A configuration in which the heater is connected to an RF filter for removing the noise signal has been disclosed to overcome such problem.

However, in a passive device included in the RF filter, there is a problem that accurate RF filtering is not able to be performed because of a stray capacitance generated in addition to an impedance generated by the passive devices.

SUMMARY

Embodiments of the inventive concept are to adjust a stray capacitance inside a RF filter by adjusting a distance between an inner wall of a housing and a circuit element.

Embodiments of the inventive concept are to perform more accurate RF filtering by adjusting a stray capacitance inside a RF filter.

The problems to be solved by the inventive concept are not limited to the problems mentioned above. Other technical problems not mentioned will be clearly understood by those skilled in the art to which the inventive concept belongs from the following description.

An apparatus for treating a substrate will be disclosed.

According to an exemplary embodiment, an apparatus for treating a substrate includes a chamber having a treating space defined in the chamber, a support unit for supporting the substrate in the treating space, a heater power source for applying electric power to a heater received in the support unit, a high-frequency power source for applying high-frequency power to a lower electrode received in the support unit, and a filter unit installed at a line for connecting the heater power source and the heater with each other to prevent high-frequency inflow, The filter unit may include a housing, one or more coils received in the housing, and an adjustment member disposed between the housing and the coil.

The adjustment member may be made of a non-magnetic material.

The adjustment member may be made of a dielectric material or may be embodied as a floating wall.

The adjustment member may be spaced from the coil at a predefined spacing, wherein the adjustment member may be spaced apart from an inner wall of the housing or may be in contact with the inner wall of the housing.

The adjustment member of the filter unit may adjust a distance between the coil and the inner wall of the housing to control a frequency blocked by the filter unit.

A thickness, a placement position, a number, and a material of the adjustment member of the filter unit may be adjusted to control the frequency blocked by the filter unit.

Another apparatus for treating a substrate according to an embodiment of the inventive concept will be disclosed.

According to an exemplary embodiment, an apparatus for treating a substrate includes a chamber having a treating space defined in the chamber, a support unit for supporting the substrate in the treating space, a heater power source for applying electric power to a heater received in the support unit, a high-frequency power source for applying high-frequency power to a lower electrode received in the support unit, and a filter unit installed at a line for connecting the heater power source and the heater with each other to prevent high-frequency inflow, wherein the filter unit includes a housing, a low pass filter received in the housing, and one or more notch filters connected to the low pass filter in series, wherein the low pass filter includes a first coil and a first capacitor, wherein the notch filter includes a second coil and a second capacitor, wherein a distance between the first coil or the second coil and an inner wall of the housing adjacent to the first coil or the second coil is adjusted to control a frequency blocked by the filter unit.

The filter unit may include an adjustment member disposed between the housing and the first coil or between the housing and the second coil.

According to another embodiment, a method for treating a substrate will be disclosed.

A method for treating a substrate using a filter, wherein the filter is disposed between and connected to a heater and a high-frequency power source to prevent high-frequency inflow, the method includes adjusting a distance between a coil and an inner wall of a housing to control a frequency to be blocked by the filter, wherein the coil is contained in the filter, and the filter is contained in the housing.

The method may further include placing an adjustment member between the coil and the inner wall of the housing to control the frequency to be blocked by the filter.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in detail with reference to the accompanying drawings such that the embodiment is easily implemented by those of ordinary skill in the art. However, the inventive concept may be implemented in many different forms and is not limited to the embodiments described herein. Moreover, in detailed descriptions of a preferred embodiment of the inventive concept, when it is determined that detailed descriptions of related known functions or components may unnecessarily obscure gist of the inventive concept, the detailed descriptions thereof may be omitted. Moreover, the same reference numerals are used for parts having similar functions throughout the drawings.

The terminology used herein is for the purpose of describing particular embodiments only and is not intended to be limiting of the inventive concept. It will be further understood that the terms "comprises", "comprising", "includes", and "including" when used in this specification, specify the presence of the stated features, integers, operations, devices, and/or components, but do not preclude the presence or addition of one or more other features, integers, operations, devices, components, and/or portions thereof. As used herein, the term "and/or" includes any and all combinations of one or more of the associated listed items.

As used herein, the singular forms "a" and "an" are intended to include the plural forms as well, unless the context clearly indicates otherwise. For simplicity and clarity of illustration, devices in the figures are not necessarily drawn to scale.

Figure 1:
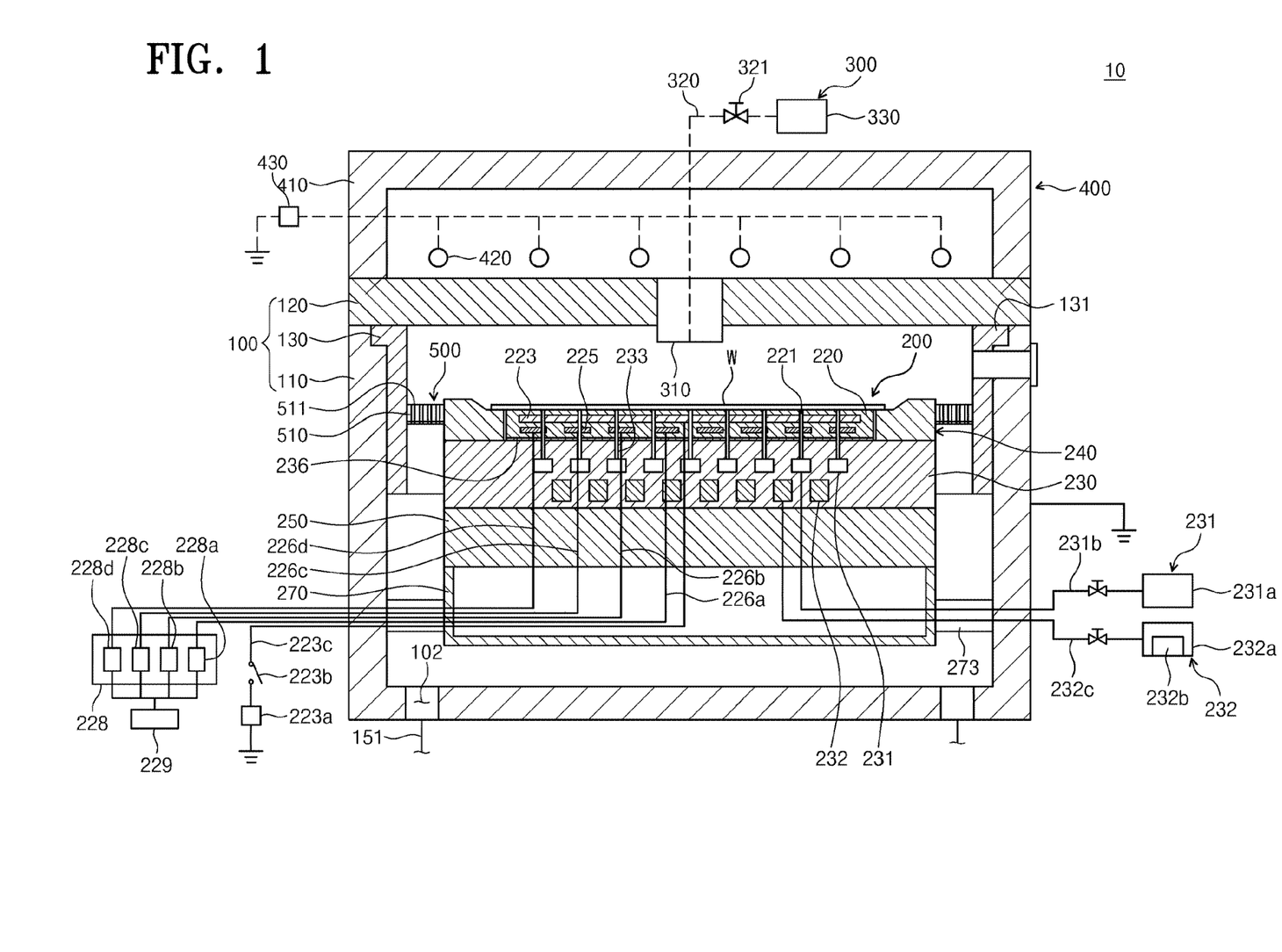
FIG. 1 is a cross-sectional view illustrating a substrate treating apparatus according to an embodiment of the inventive concept.

FIG. 1 is a cross-sectional view illustrating a substrate treating apparatus according to an embodiment of the inventive concept.

Referring to FIG. 1, a substrate treating apparatus 10 treats a substrate W using plasma. For example, the substrate treating apparatus 10 may perform an etching process on the substrate W. The substrate treating apparatus 10 includes a chamber 100, a support unit 200, a gas supply unit 300, a plasma source 400 and an exhaust unit 500.

The chamber 100 has a treating space for treat the substrate defined therein. The chamber 100 includes a housing 110, a cover 120, and a liner 130.

The housing 110 has a space with an open top surface defined therein. An internal space of the housing 110 is defined as a treating space where a substrate treating process is performed. The housing 110 is made of a metal material.

The housing 110 may be made of an aluminum material. The housing 110 may be grounded. An exhaust hole 102 is defined in a bottom surface of the housing 110. The exhaust hole 102 is connected to an exhaust line 151. A reaction by-product generated during the process and gas remaining in the internal space of the housing 110 may be discharged to the outside through the exhaust line 151. An interior of housing 110 is decompressed to a predefined pressure by an exhaust process.

The cover 120 covers the open top surface of the housing 110. The cover 120 is formed in a plate shape, and seals the internal space of the housing 110. The cover 120 may include a dielectric substance window. The liner 130 is disposed inside the housing 110. The liner 130 has an internal space with open top surface and bottom surface defined therein. The liner 130 may be formed in a cylindrical shape. The liner 130 may have a radius corresponding to an inner surface of the housing 110.

The liner 130 is disposed along the inner surface of the housing 110. A support ring 131 is formed at an upper end of the liner 130. The support ring 131 is formed in a ring-shaped plate and protrudes out of the liner 130 along a perimeter of the liner 130. The support ring 131 is placed at an upper end of the housing 110 and supports the liner 130. The liner 130 may be made of the same material as the housing 110. The liner 130 may be made of the aluminum material. The liner 130 protects the inner surface of the housing 110. For example, arc discharge may be generated inside the chamber 100 during a process in which the gas is excited.

The arc discharge damages surrounding apparatuses. The liner 130 protects the inner surface of the housing 110 to prevent the inner surface of housing 110 from being damaged by the arc discharge. Moreover, the liner 130 prevents the reaction byproduct generated during the substrate treating process from being deposited on an inner wall of the housing 110. The liner 130 is cheaper than the housing 110 and is easy to be replaced. Thus, when the liner 130 is damaged by the arc discharge, an operator may replace the liner 130 with the new liner 130.

The support unit 200 supports the substrate in the treating space inside the chamber 100. For example, the support unit 200 is disposed inside the housing 110. The support unit 200 supports the substrate W. The support unit 200 may use an electrostatic chuck scheme for sucking the substrate W using an electrostatic force. Alternatively, the support unit 200 may support the substrate W in various schemes, such as mechanical clamping.

Hereinafter, the support unit 200 using the electrostatic chuck scheme will be described.

The support unit 200 includes a support plate 220, an electrostatic electrode 223, a channel forming plate 230, a focusing ring 240, an insulating plate 250, and a lower cover 270. The support unit 200 may be disposed to be spaced upward from the bottom surface of the housing 110 inside the chamber 100.

The support plate 220 is located at an upper end of the support unit 200. The support plate 220 is provided as a dielectric substance in a shape of a disc. The substrate W is placed on a top surface of the support plate 220. A first supply channel 221 used as a passage through which heat transfer gas is supplied to a bottom surface of the substrate W is formed in the support plate 220.

The electrostatic electrode 223 is embedded in the support plate 220. The electrostatic electrode 223 is electrically connected to a first lower power source 223a. The electrostatic force acts between the electrostatic electrode 223 and the substrate W by a current applied to the electrostatic electrode 223, and the substrate W is sucked to the support plate 220 by the electrostatic force.

The channel forming plate 230 is located beneath the support plate 220. A bottom surface of the support plate 220 and a top surface of the channel forming plate 230 may be glued with an adhesive 236. A first circulating channel 231, a second circulating channel 232, and a second supply channel 233 are formed in the channel forming plate 230. The first circulating channel 231 is provided as a passage through which the heat transfer gas circulates. The second circulating channel 232 is provided as a passage through which cooling fluid circulates. The second supply channel 233 connects the first circulating channel 231 and the first supply channel 221 with each other. The first circulating channel 231 is provided as a passage through which the heat transfer gas circulates. The first circulating channel 231 may be formed in a spiral shape inside the channel forming plate 230. Alternatively, the first circulating channel 231 may be disposed such that flow paths of ring shapes having different radii have the same center. The first circulating channels 231 may communicate with each other. The first circulating channels 231 are formed at the same height.

The first circulating channel 231 is connected to heat-transfer medium storage 231a through a heat-transfer medium supply line 231b. The heat-transfer medium storage 231a stores a heat-transfer medium. The heat-transfer medium includes an inert gas. The heat-transfer medium may include helium (He) gas. The helium gas is supplied to the first circulating channel 231 through the heat-transfer medium supply line 231b, and is supplied to the bottom surface of the substrate W sequentially through the second supply channel 233 and the first supply channel 221. The helium gas serves as the medium for helping heat exchange between the substrate W and the support plate 220. Therefore, a temperature is uniform throughout the substrate W.

The second circulating channel 232 is connected to cooling fluid storage 232a through a cooling fluid supply line 232c. The cooling fluid storage 232a stores the cooling fluid. In the cooling fluid storage 232a, a cooler 232b may be provided. The cooler 232b cools the cooling fluid to a predefined temperature. Alternatively, the cooler 232b may be installed on a cooling fluid supply line 232c. The cooling fluid supplied to the second circulating channel 232 through the cooling fluid supply line 232c circulates along the second circulating channel 232 and cools the channel forming plate 230. As the channel forming plate 230 is cooled, the support plate 220 and the substrate W are cooled together to maintain substrate W at a predefined temperature. For the reasons described above, generally, a lower portion of the focusing ring 240 has a lower temperature than an upper portion thereof. The focusing ring 240 is placed at a rim region of the support unit 200. The focusing ring 240 has a ring shape and is provided to surround the support plate 220. For example, the focusing ring 240 is placed along a perimeter of the support plate 220 to support an outer region of the substrate W.

The insulating plate 250 is located beneath the channel forming plate 230. The insulating plate 250 is made in an insulating material, and electrically insulates the channel forming plate 230 and the lower cover 270. The lower cover 270 is located at a lower end of the support unit 200. The lower cover 270 is located spaced upward from the bottom surface of the housing 110. The lower cover 270 defined a space with an open top surface therein. The top surface of the lower cover 270 is covered by the insulating plate 250. Therefore, an outer radius of a cross section of the lower cover 270 may have the same length as an outer radius of the insulating plate 250. A lift pin, and the like for receiving the returned substrate W from an external returning member and seating the substrate W on the support plate may be located in the internal space of the lower cover 270.

The lower cover 270 has a connection member 273. The connection member 273 connects an outer surface of the lower cover 270 to the inner wall of the housing 110. A plurality of connection members 273 may be arranged at regular spacings on the outer surface of the lower cover 270. The connection member 273 supports the support unit 200 inside the chamber 100. Moreover, the connection member 273 is connected to the inner wall of the housing 110, so that the lower cover 270 is electrically grounded.

A first power source line 223c connected to the first lower power source 223a, the heat-transfer medium supply line 231b connected to the heat-transfer medium storage 231a, the cooling fluid supply line 232c connected to the cooling fluid storage 232a and the like extend inward of the lower cover 270 through an internal space of the connection member 273.

The gas supply unit 300 supplies the gas to the treating space inside the chamber 100. The gas supplied by the gas supply unit 300 includes process gas used for treating the substrate. Moreover, the gas supply unit 300 may supply cleaning gas used to clean the interior of the chamber 100.

The gas supply unit 300 includes a gas supply nozzle 310, a gas supply line 320, and gas storage 330. The gas supply nozzle 310 is installed at a center of the cover 120. A nozzle is defined in a bottom surface of the gas supply nozzle 310. The nozzle is located below the cover 120, and supplies the gas into the chamber 100. The gas supply line 320 connects the gas supply nozzle 310 and the gas storage 330 with each other. The gas supply line 320 supplies the gas stored in the gas storage 330 to the gas supply nozzle 310. A valve 321 is installed on the gas supply line 320. The valve 321 opens and closes the gas supply line 320, and adjusts a flow rate of the gas supplied through the gas supply line 320.

The plasma source 400 generates plasma from the gas supplied into the treating space inside the chamber 100. The plasma source 400 is disposed outside the treating space of the chamber 100. According to one embodiment, as the plasma source 400, an inductively coupled plasma (ICP) source may be used. The plasma source 400 includes an antenna chamber 410, an antenna 420, and a plasma power source 430. The antenna chamber 410 is formed in a cylindrical shape with an open bottom. The antenna chamber 410 has a space defined therein. The antenna chamber 410 is disposed to have a diameter corresponding to the chamber 100. A lower end of the antenna chamber 410 is detachable from the cover 120. The antenna 420 is disposed inside the antenna chamber 410. The antenna 420 is provided as a coil having a spiral shape wound multiple times, and is connected to the plasma power source 430. The antenna 420 receives power from the plasma power source 430. The plasma power source 430 may be located outside the chamber 100. The antenna 420 to which the power is applied may form an electromagnetic field in the treating space of the chamber 100. The process gas is excited in a plasma state by the electromagnetic field.

The exhaust unit 500 is located between the inner wall of the housing 110 and the support unit 200. The exhaust unit 500 includes an exhaust plate 510 having a through-hole 511 defined therein. The exhaust plate 510 is formed in an annular ring shape. The plurality of through-holes 511 are defined in the exhaust plate 510. The process gas provided in the housing 110 passes through the through-holes 511 of the exhaust plate 510 and then is exhausted into the exhaust hole 102. The flow of the process gas may be controlled based on the shape of the exhaust plate 510 and a shape of the through-holes 511.

Heaters 225 are embedded in the support plate 220. The heaters 225 are located below the electrostatic electrode 223. The heaters 225 may be arranged in different regions in the support plate 220 to heat the support unit 200 at different regions of the substrate W.

A heater power source 229 is disposed to apply heating power to the heaters 225. A filter unit 228 blocks a high-frequency from the heating power supplied by the heater power source 229. In one embodiment, when the plasma is generated by applying a 1356 MHz high-frequency power by the plasma source 400, the filter unit 228 may be designed to pass heating power, which is, for example, 60 Hz AC power, through heater cables 226a to 226d, and blocks 1356 MHz RF from entering the heater power source 229. The filter unit 228 may be provided as circuit elements 228a to 228d such as capacitors, inductors, and the like.

The plurality of heater cables 226a to 226d connect the filter unit 228 to the heaters 225, and transfer the applied heat power from the heater power source 229 to the heaters 225. The heater cables 226a to 226d may extend into the lower cover 270 through the internal space of the connection member 273. The heaters 225 are electrically connected to the heater cables 226a to 226d, respectively, and generate the heat by resisting the heating power (currents) respectively applied from the heater cables 226a to 226d, respectively. The generated heat is transferred to the substrate W through the support plate 220. The substrate W is maintained at the predefined temperature by the heat generated by heaters 225.

Figure 2A:
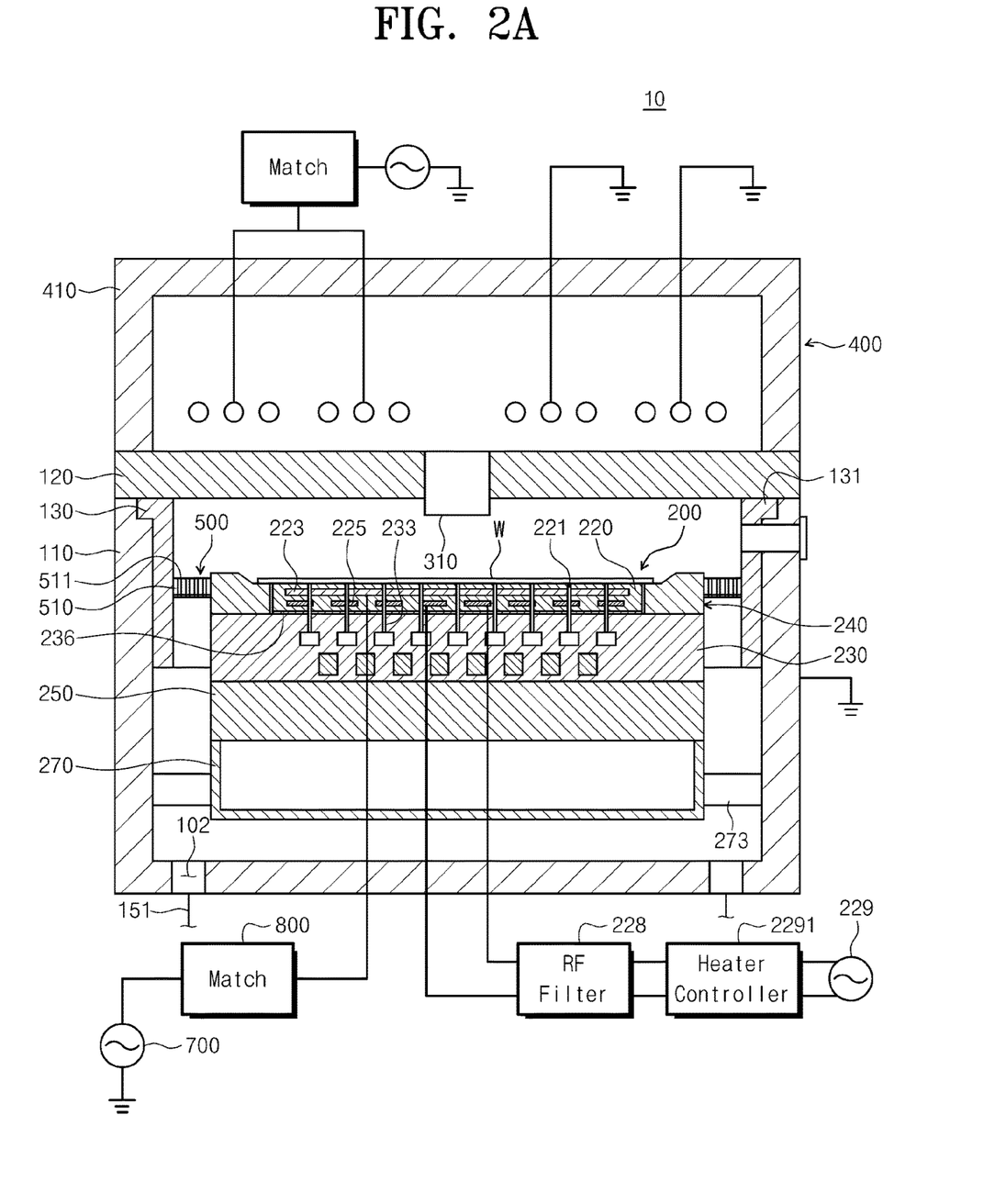
FIGS. 2A to 2B are views illustrating a substrate treating apparatus according to an embodiment of the inventive concept in more detail.
Figure 2B:
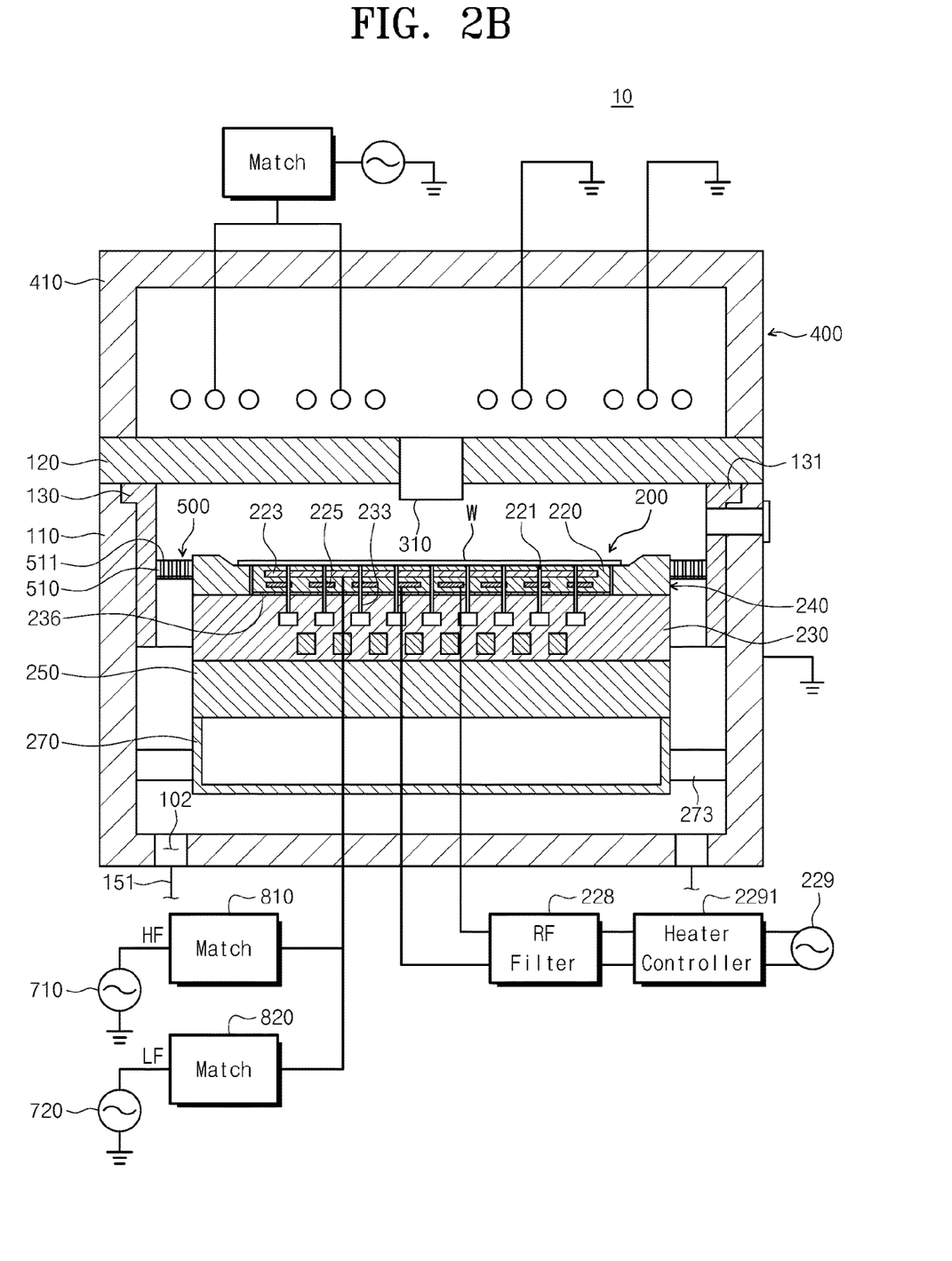

FIGS. 2A to 2B are views illustrating a substrate treating apparatus according to an embodiment of the inventive concept in more detail.

FIG. 2A discloses a high-frequency power source 700 and a matching device 800 connected to the electrostatic electrode 223 included in an electrostatic chuck. According to FIG. 2B corresponding to another embodiment of the inventive concept, matching devices 810 and 820, which are respectively matched with a high-frequency power source 710 and a low-frequency power source 720 connected to the electrostatic electrode 223 included in the electrostatic chuck, are disclosed.

According to FIGS. 2A to 2B, a heater 225 may be affected by RF coupling generated by applying the high-frequency power sources 700 and 710 and the low-frequency power source 720 to the electrode 223. Therefore, when the filter unit 228 is not present, heater 225 may be damaged because of high-frequency coupling. Therefore, the heater 225 is configured such that the filter unit 228 is essentially connected thereto, so that remaining frequencies except for a power 229 applied to the heater 225 may be blocked. An applied temperature, an applied time, and the like of the heater 225 may be controlled by a heater controller 2291.

In a case of FIG. 2A, the filter unit 228 may block the high-frequency power source 700. In a case of FIG. 2B, the filter unit 228 may block the relative low-frequency power source 720 and the high-frequency power source 710 together. According to an example, a plurality of power sources connected to the electrostatic electrode 223 may be connected to each other and various mixed signals may be applied to the electrode 223. Therefore, the filter unit 228 included in the heater must block remaining disturbance signals except for the power 229 driving the heater 225.

Figure 3:
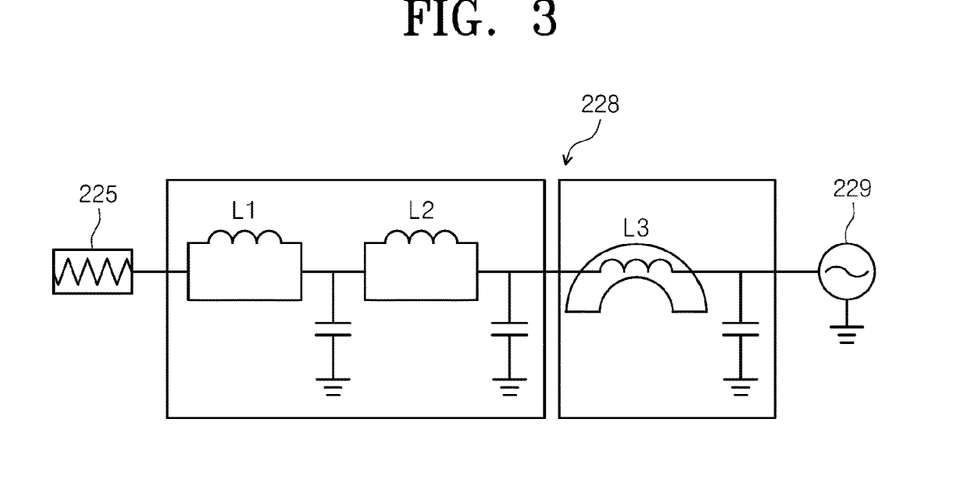
FIG. 3 is a view illustrating a circuit diagram of a filter unit according to an embodiment of the inventive concept.

FIG. 3 is a view illustrating a circuit diagram of a filter unit 228 according to an embodiment of the inventive concept.

Other embodiments of the filter unit 228 are variously disclosed in FIGS. 6 to 11 to be described later. However, the filter unit 228 may not be limited to that disclosed in the specification of the inventive concept, and may be provided as a filter circuit modified in a range capable of easily changing a design at the level of knowledge of a person skilled in the art.

The filter unit 228 according to FIG. 3 may be connected between a resistance in a heater 255 and the heater power source 229. The filter unit 228 according to FIG. 3 may be a filter circuit filtering the high-frequency power source 710 or the low-frequency power source 720 according to FIG. 2B. The filter unit 228 according to FIG. 3 may include a high-frequency filter and a low-frequency filter. The filter unit 228 according to FIG. 3 may include a notch filter including a first inductor L1, a second inductor L2, and a capacitor connected to a front end of the circuit and a low pass filter including a third inductor L3. The notch filter may be used as a specific-frequency or high-frequency filter, and the low-pass filter may be used as the low-frequency filter.

Hereinafter, a method for adjusting a frequency in the filter unit 228 as shown in FIG. 3 will be described using a perspective view of the filter unit 228 according to FIG. 4.

Figure 4A:
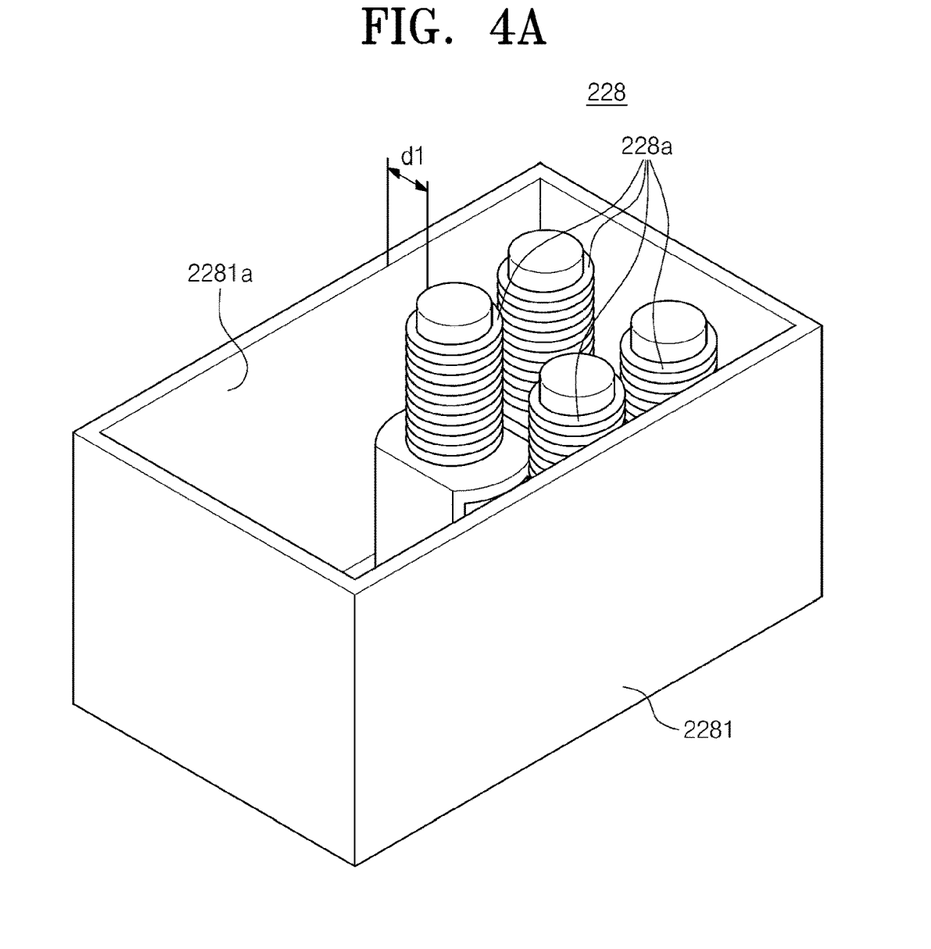
FIGS. 4A to 4C are perspective views of a filter unit according to an embodiment of the inventive concept.
Figure 4B:
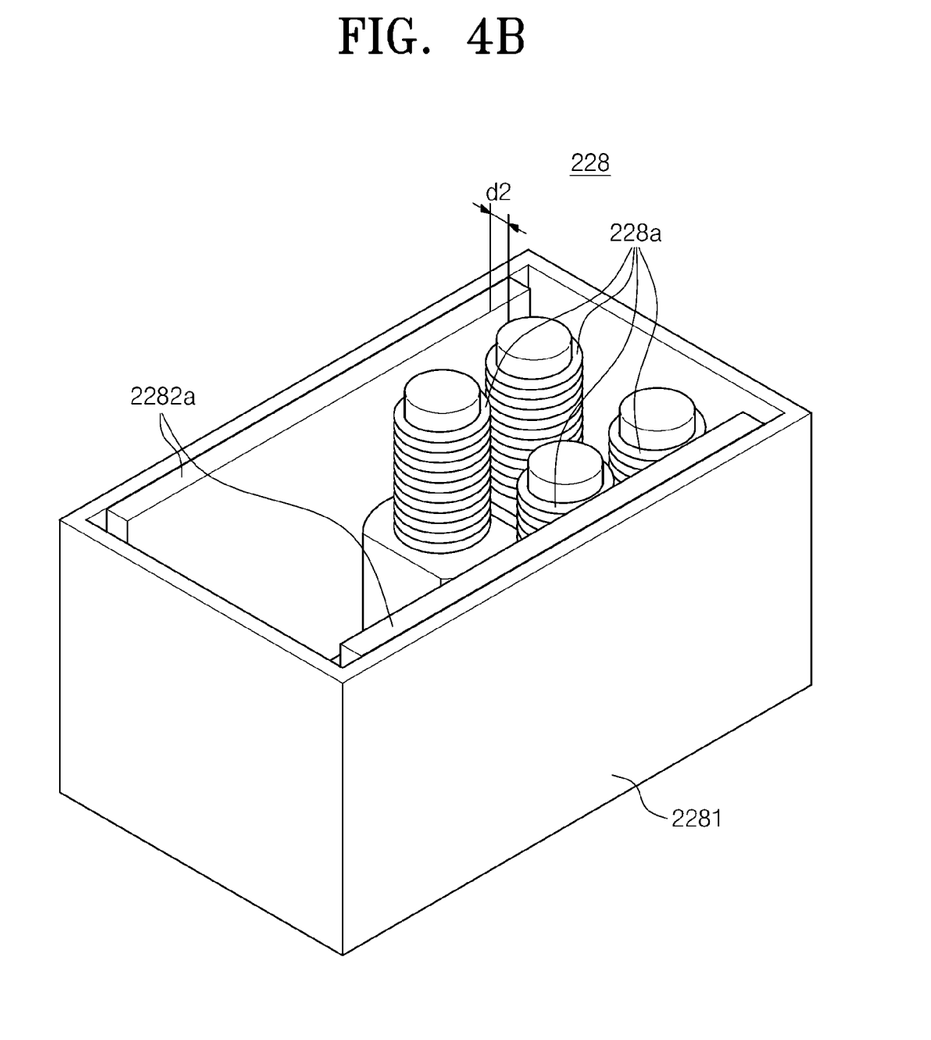
Figure 4C:
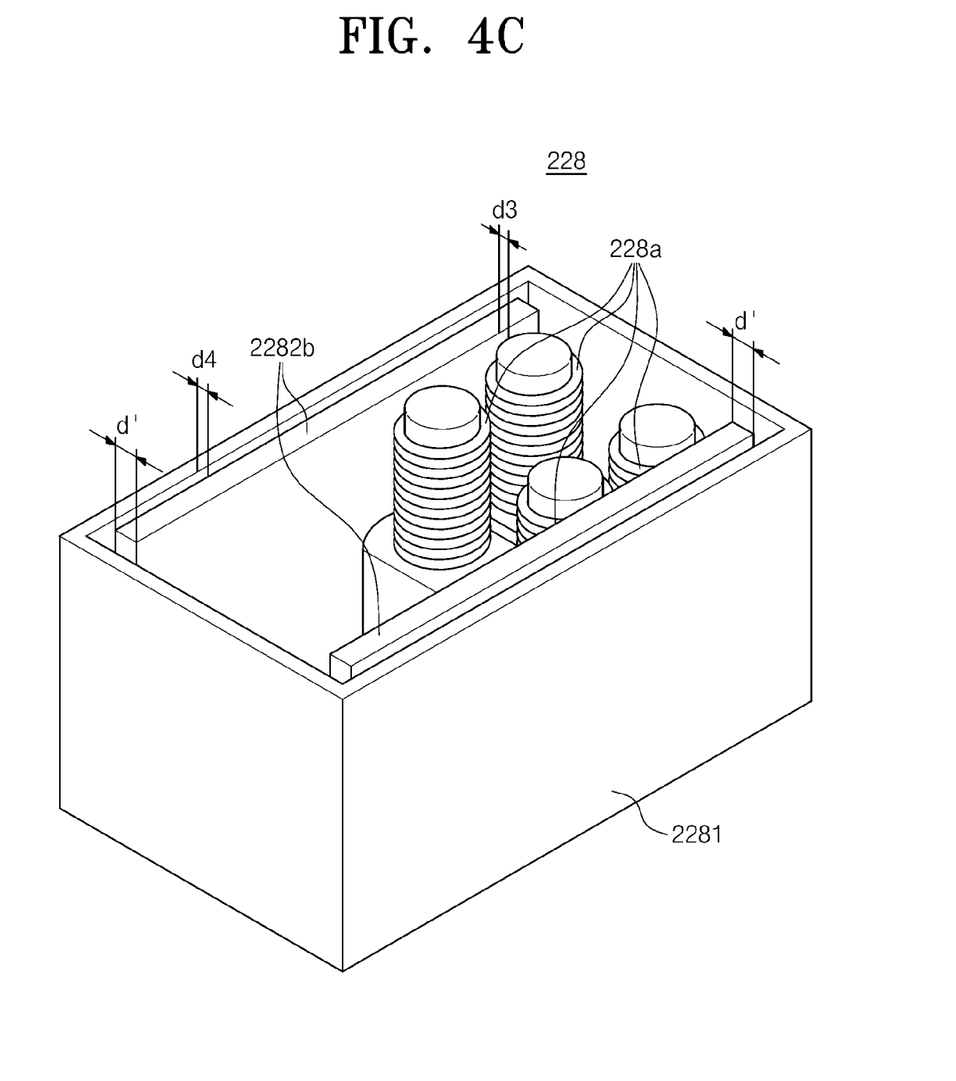

FIGS. 4A to 4C are perspective views of the filter unit 228 according to an embodiment of the inventive concept.

In general, tuning of the filter unit 228 may be performed by adjusting a value of the inductor L or the capacitor C included in the filter unit 228. However, because of a stray capacitance generated in addition to adjustment of a passive device included in the circuit of the filter unit 228, a tuning result of the filter unit 228 may be different. The stray capacitance, which means a parasitic capacitance, means a capacitance generated unintentionally other than a capacitance generated by the passive device included in the circuit. Because such stray capacitance may affect an accuracy in a filtering process, there is a need to adjust such stray capacitance.

According to the perspective view of the filter unit 228 as shown in FIG. 4, circuit elements 228a constituting the filter unit 228 may be arranged in a housing 2281. The circuit elements 228a constituting the filter unit 228 may be coils. The coils of the filter unit 228 in FIG. 4 may be air coils. The circuit elements 228a included in the filter unit 228 are included in the housing 2281, so that the stray capacitance may be generated between the inner wall of the housing 2281 and the circuit elements 228a in the filtering process. Each wall of the housing 2281 may be grounded.

A filter constituted by the coils in FIG. 4 may be the notch filter. Although not shown in the perspective view of FIG. 4, the filter unit of FIG. 4 may additionally include a coil wound in a circle included in the low-pass filter. In circuits shown in FIGS. 6 to 11 below, in a case of the coil wound in the circle of the low-pass filter, the coil is indicated by adding a semi-circle shape thereto, so that it is indicated that the coil is included in the low pass filter.

FIG. 4A illustrates a perspective view of the filter unit 228 including circuit elements 228a in the housing 2281. The coils included in FIG. 4A may be coils included in the notch filter. According to FIG. 4A, the parasitic capacitance may occur because of the coil included in the housing 2281, which may be affected by a distance d1 between the coil and inner wall 2281a of the housing 2281.

The filter unit 228 according to the inventive concept may further include an adjustment member 2282 to adjust the stray capacitance generated between the circuit elements constituting the filter unit 228 and the inner wall 2281a of the housing. Such embodiment is illustrated in FIGS. 4B to 4C.

A resonant frequency in the filter unit 228 may be represented as follows.

$$w_C = \frac{1}{\sqrt{L_1 C_3}}$$

In addition, a value of the capacitance may be adjusted by a following equation.

$$C = \epsilon_0 \epsilon_r \frac{A}{d} = \epsilon \frac{A}{d}$$

Based on the equation, the capacitor is inversely proportional to a distance. When applying the above equation, the parasitic capacitance is inversely proportional to the distance between the inner wall of the housing and the coil. That is, the distance d1 in FIG. 4A is changed and adjusted through the adjustment member 2282, so that the stray capacitance may be adjusted, and thus, the resonance frequency inside the filter unit 228 may be adjusted. In addition, a Cs (stray capacitance) value may be adjusted by changing a thickness and a distance from the inner wall of the housing of the adjustment member 2282, and a dielectric permittivity of the adjustment member 2282, and thus, the resonance frequency may be adjusted. The change in dielectric permittivity may be adjusted through air, a Teflon material, an insulating material, and the like.

According to FIGS. 4B to 4C, the filter unit 228 according to the inventive concept may adjust the value of the stray capacitance by placing the adjustment member 2282 between the circuit element 228a and the housing inner wall 2281a. The adjustment member 2282 may be provided as a non-magnetic material. Alternatively, the adjustment member 2282 according to the inventive concept may be a dielectric material. The dielectric material may be Teflon. When the adjustment member 2282 contains the dielectric material, arcing may be prevented. The adjustment member 2282 may be a floating wall disposed to be spaced apart from the circuit element 228a and the inner wall 2281a of the housing.

When the adjustment member 2282 is disposed, the distance between the circuit element 228a and the inner wall 2281a of the housing is reduced. Thus, the parasitic capacitance may be increased.

The filter unit 228 according to the inventive concept may adjust the frequency blocked by the filter unit 228 by adjusting the thickness or a placement position, or the number of the adjustment member 2282.

When the thickness of the adjustment member 2282 is adjusted, and when the adjustment member 2282 is thicker, the distance between the circuit element 228a and the inner wall 2281a of the housing is more reduced, so that a larger stray capacitance value may be obtained.

When the number of adjustment member 2282 is adjusted, the plurality of adjustment members 2282 may be included. In this case, a plurality of capacitances may be arranged in series.

When the adjustment member 2282 is placed as close as possible to the circuit element 228a by adjusting the placement position of the adjustment member 2282, a distance between the adjustment member 2282 and the circuit element 228a is reduced, and thus a relatively large stray capacitance value may be obtained. When the adjustment member 2282 is set to be far from the coil by adjusting the placement position of the adjustment member 2282, a relatively small stray capacitance value may be obtained because of increasing of the distance.

The adjustment member 2282 may be the floating wall. The floating wall may be located between the circuit element 228a and the inner wall 2281a of the housing, and may be installed at a position spaced apart from the circuit element 228a and the inner wall 2281a of the housing. The position where the floating wall is installed may be adjusted between the coil and the inner wall of the housing based on a desired stray capacitance. A plurality of floating walls may be arranged. The position where the floating wall is installed may vary.

An adjustment member 2282a in FIG. 4B may be the dielectric material. According to FIG. 4B, the adjustment member 2282a is in contact with the inner wall of the housing, so that the distance between the inner wall of the housing and the coil may be substantially regarded as equal to a distance d2 between the adjustment member 2282 and the coil. As a result, the distance between the circuit element and the inner wall of the housing decreases, so that the parasitic capacitance is increased.

An adjustment member 2282b in FIG. 4C may be the floating wall. According to FIG. 4C, the adjustment member 2282 is spaced apart from the inner wall 2281a of the housing, so that an effect that capacitors are connected to each other in series may appear. That is, an effect that a capacitor having a distance of d3 and a capacitor having a distance of d4 (d4=d1−d3−d') are connected to each other in series may be obtained. In an embodiment as shown in FIG. 4C, the parasitic capacitance may be adjusted to a desired value by adjusting a placement position of the floating wall or the number of floating walls.

As shown in FIGS. 4B to 4C, the stray capacitance may be adjusted by adjusting the distance between the inner wall 2281a of the housing and the device included in the filter unit 228, so that more accurate tuning of the filter unit 228 is available.

When developing the filter unit 228, a transfer characteristic of the filter and an impedance of the electrostatic chuck should be considered. In the inventive concept, the stray capacitance may be adjusted by adjusting the distance to the inner wall of the housing containing the filter, and cutoff frequency of a high frequency may be controlled. In addition, when the distance between the inner wall and the coil is adjusted, the impedance of the electrostatic chuck may be adjusted, so that a more uniform treatment is possible. More specifically, when a distance between the heater cable and the wall is controlled, the stray capacitance Cs is changed, thereby affecting a value of Vrms measured by an output sensor of a bias matcher. Therefore, when the Cs is adjusted, the Vrms value may be controlled, so that the impedance of the electrostatic chuck may be controlled, thereby controlling E/R.

Figure 5:
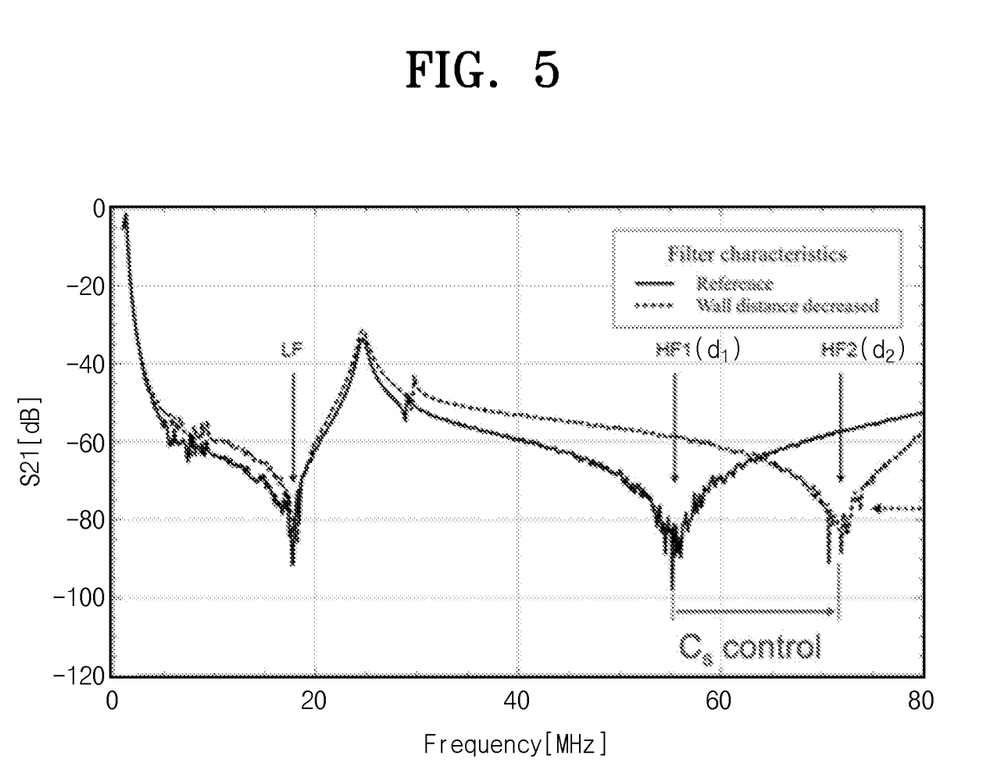
FIG. 5 is a graph of a frequency change resulting from adjusting the frequency through an adjustment member according to the inventive concept.

FIG. 5 is a graph of a frequency change resulting from adjusting the frequency through the adjustment member 2282 according to the inventive concept. A transfer characteristic S21 of a filter according to FIG. 5 may be measured through a vector network analyzer (VNA) test.

According to FIG. 5, when the distance to the inner wall of the housing according to FIG. 4A is d1, the resonant frequency appears to be 55 MHz, but when the distance to the inner wall of the housing according to FIG. 4B is d2, the resonance frequency appears to be about 72 MHz. As a result, it is disclosed that the resonant frequency in the filter unit 228 may be easily changed by changing the distance to the inner wall of the housing. That is, characteristics of the filter may be tuned by adjusting the distance between the coil and the inner wall of the housing.

In FIG. 5, an embodiment in which a resonance frequency of the notch filter is adjusted by adjusting a distance between the coil included in the notch filter and the inner wall of the housing is disclosed, but a resonance frequency of the low pass filter may also be adjusted by adjusting a distance between the coil included in the low pass filter and the inner wall. Various embodiments of the coil included in the low pass filter may be disclosed.

FIGS. 6 to 11 illustrate circuit diagrams of various embodiments of a filter unit according to the inventive concept.

FIGS. 6 to 11 illustrate circuit diagrams of various embodiments of the filter unit 228 according to the inventive concept. However, embodiments of the corresponding filter unit are not limited to the illustrated embodiments. The filter unit may be provided by being easily changed in a design in a range capable of filtering a high-frequency power in addition to the illustrated embodiments.

Figure 6:
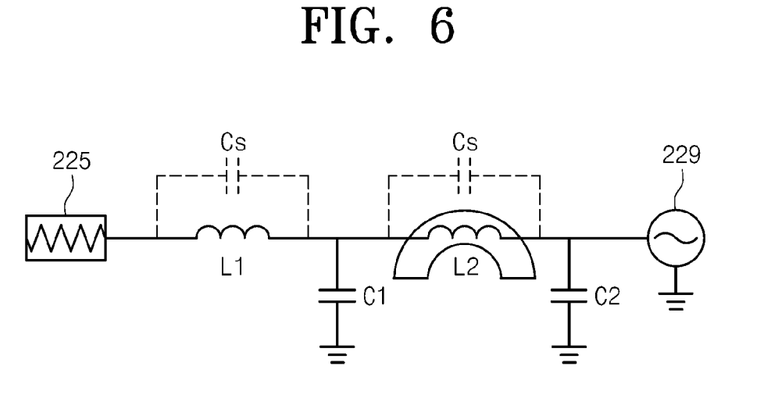
FIGS. 6 to 11 illustrate circuit diagrams of various embodiments of a filter unit according to the inventive concept.

FIG. 6 discloses a configuration in which two low-pass filters are connected to each other in series between the heater 225 and an AC power source 229. As described above, the semi-circular shape in the L2 is an expression for showing an embodiment of the inductor in the low pass filter. As shown in FIG. 6, the stray capacitance Cs may be generated in the L1 and the L2 connected with each other in series.

Figure 7:
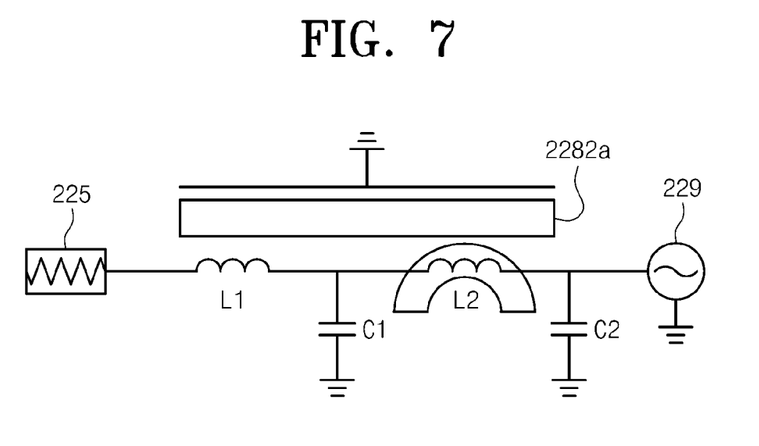
Figure 8:
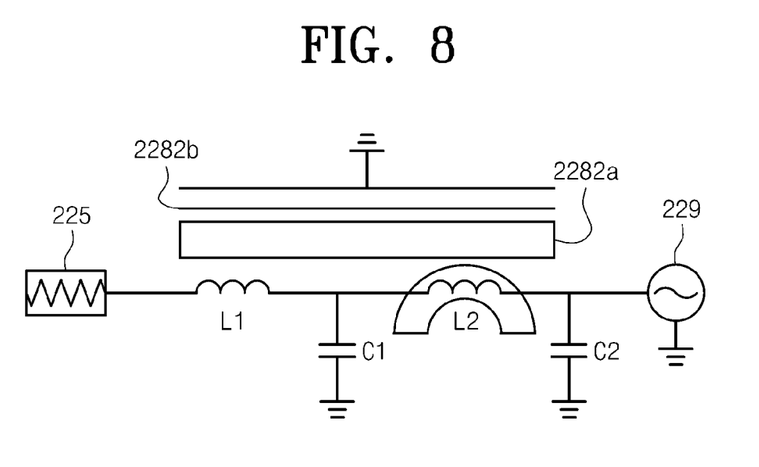

Configurations of a filter circuit 228 including the adjustment member 2282 for adjusting the stray capacitance Cs are illustrated in circuit diagrams in FIGS. 7 to 8.

FIG. 7 discloses a configuration in which two low pass filters are connected to each other in series between the heater 225 and the AC power source 229. A difference from FIG. 6 is that a configuration including the dielectric material 2282a in a portion between the inductors L1 and L2 and the housing inner wall (indicated as ground) illustrated in FIG. 6 is disclosed. According to FIG. 7, the stray capacitance Cs generated in FIG. 6 may be adjusted by including the dielectric material between the inductors L1 and L2 and the housing inner wall (indicated as ground).

FIG. 8 discloses a configuration in which two low pass filters are connected to each other in series between the heater 225 and the AC power source 229. A difference from FIG. 6 is that a configuration including the dielectric material 2282a in the portion between the inductors L1 and L2 and the housing inner wall (indicated as ground) illustrated in FIG. 6 is disclosed and the floating wall 2282b is further added in addition to the dielectric material 2282a. As such, the dielectric material 2282a and the floating wall 2282b may be applied together as the adjustment member 2282. As the floating wall 2282b is added, an effect of connecting parasitic capacitors with each other in series may occur. Alternatively, a configuration in which only the floating wall 2282b is included except for the dielectric material may also be disclosed.

Figure 9:
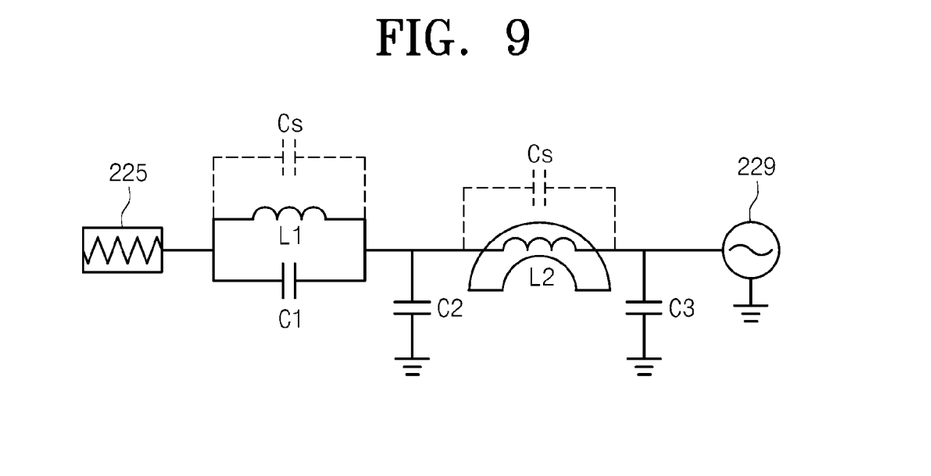
Figure 10:
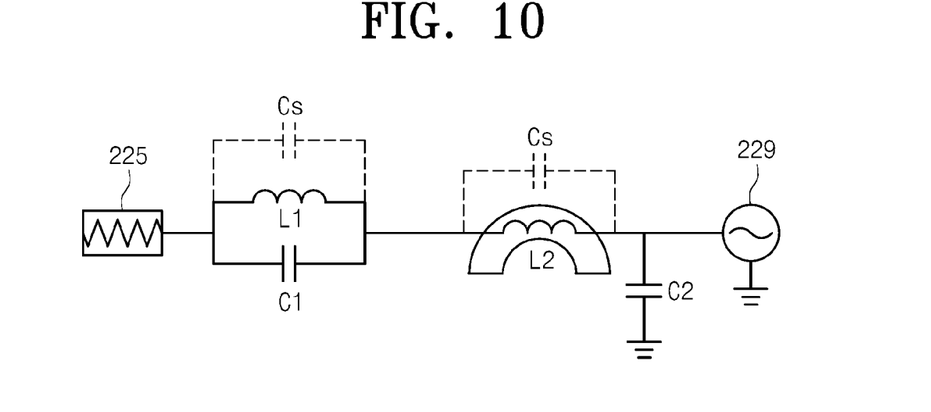
Figure 11:
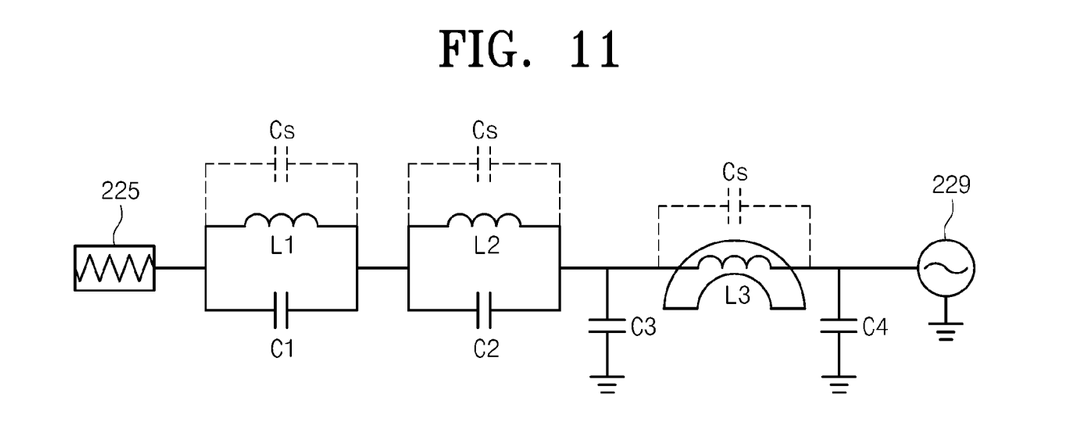

FIG. 9 discloses a configuration in which one notch filter and one low pass filter are connected to each other in series between the heater 225 and the AC power source 229. FIG. 10 discloses a configuration in which another embodiment of one notch filter and one low pass filter are connected to each other in series between the heater 225 and the AC power source 229. FIG. 11 discloses a configuration in which two notch filters and one low pass filter are connected to each other in series between the heater 225 and the AC power source 229.

In the embodiments of the filter unit 228 in FIGS. 9 to 11, the stray capacitance may be adjusted by adjusting the distance between the inner wall of the housing and the inductors L1, L2, and L3 through the adjustment member 2282. The placement position, the number, the thickness, the material, or the like of the adjustment member 2282 are adjusted such that stray capacitances of the plurality of filters included in the filter unit 228 are adjusted independently. Alternatively, the stray capacitances of the plurality of filters may be adjusted to be equal to each other.

According to one embodiment, the adjustment member 2282 may be disposed only in the notch filter to adjust the stray capacitance. According to one embodiment, the adjustment member 2282 may be disposed only in the low-pass filter to adjust the stray capacitance. According to one embodiment, each adjustment member 2282 is disposed at each of the low pass filter and the notch filter to adjust the stray capacitance.

Through such embodiments, the resonance frequency inside the filter unit 228 may be easily adjusted. The inventive concept may be equally to be applied in a case when the plurality of filters are used. In addition, the adjustment member 2282 may be modified. In addition, the number of filters may correspond to the number of heater zones. In addition, the number of filter units for controlling the heaters may also correspond to the number of heaters. Therefore, stray capacitances of the plurality of filter units may be independently adjusted.

In the inventive concept, the stray capacitance inside the RF filter may be adjusted by adjusting the distance between the inner wall of the housing and the circuit element.

In the inventive concept, more accurate RF filtering may be performed by adjusting the stray capacitance inside the RF filter.

In the inventive concept, the impedance of the electrostatic chuck may be adjusted by adjusting the distance between the inner wall of the housing and the circuit element.

The effects of the inventive concept are not limited to the effects described above. Effects not mentioned will be clearly understood by those skilled in the art to which the inventive concept belongs from the present specification and the accompanying drawings.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a chamber having a treating space defined in the chamber;
   a chuck for supporting the substrate in the treating space;
   a power source for applying electric power to a heater received in the chuck;
   a high-frequency power source for applying high-frequency power to a lower electrode received in the chuck; and
   a filter unit installed at a line for connecting the power source and the heater with each other to prevent high-frequency inflow, wherein the filter unit includes:
a housing;
one or more coils disposed in the housing; and
a barrier disposed between an inner wall of the housing and the one or more coils only in a width direction of the housing, in a plan view from a top of the filter unit, the barrier being located adjacent to the one or more coils,
wherein a thickness, a placement position, a number, and a material of the barrier are adjusted to adjust a floating capacity between the one or more coils and the housing for adjusting a frequency blocked by the filter unit,
wherein, in the width direction, the barrier is spaced from the one or more coils at a predefined distance,
wherein, in the plan view, an entirety of the barrier is located outside of the one or more coils,
wherein, in the width direction, the barrier overlaps with each of the one or more coils located in the housing, and
wherein the barrier is spaced apart from an inner wall of the housing.

2. The apparatus of claim 1, wherein the barrier includes a non-magnetic material.

3. The apparatus of claim 2, wherein the barrier includes a dielectric material or is embodied as a floating wall.

4. The apparatus of claim 3, wherein the barrier of the filter unit adjusts a distance between the coil and the inner wall of the housing to control the frequency blocked by the filter unit.

5. An apparatus for treating a substrate, the apparatus comprising:
a chamber having a treating space defined in the chamber;
a chuck for supporting the substrate in the treating space;
a power source for applying electric power to a heater received in the chuck;
a high-frequency power source for applying high-frequency power to a lower electrode received in the chuck; and
a filter unit installed at a line for connecting the power source and the heater with each other to prevent high-frequency inflow,
wherein the filter unit includes:
a housing;
a low pass filter received in the housing;
one or more notch filters connected to the low pass filter in series,
wherein the low pass filter includes a first coil and a first capacitor, and
wherein the notch filter includes a second coil and a second capacitor; and
a barrier only in a width direction of the housing disposed between the housing and the first coil or between the housing and the second coil, in a plan view from a top of the filter unit, the barrier being located adjacent to the first coil or the second coil,
wherein a distance between the first coil or the second coil and an inner wall of the housing adjacent to the first coil or the second coil is adjusted to control a frequency blocked by the filter unit,
wherein a thickness, a placement position, a number, and a material of the barrier are adjusted to adjust a floating capacity between the first coil or the second coil and an inner wall of the housing for adjusting the frequency blocked by the filter unit,
wherein, in the width direction, the barrier is spaced from the first coil or the second coil at a predefined distance,
wherein, in the plan view, an entirety of the barrier is located outside of the first coil and the second coil,
wherein, in the width direction, the barrier overlaps with each of the one or more coils located in the housing, and
wherein the barrier is spaced apart from an inner wall of the housing.

6. The apparatus of claim 5, wherein the barrier includes a non-magnetic material.

7. The apparatus of claim 6, wherein the barrier includes a dielectric material or is embodied as a floating wall.

8. A filter unit disposed between and connected to a heater and a high-frequency power source to prevent high-frequency inflow, the filter unit comprising:
a housing;
one or more coils disposed in the housing; and
a barrier disposed only in a width direction of the housing between an inner wall of the housing and the one or more coils to adjust a stray capacity between the one or more coils and the housing to block a frequency blocked by the filter unit, in a plan view from a top of the filter unit, the barrier being located adjacent to the one or more coils,
wherein a floating capacity between the one or more coils and an inner wall of the housing is controlled by adjusting a thickness, a placement position, a number, and a material of the barrier to adjust the frequency blocked by the filter unit,
wherein, in the width direction, the barrier is spaced from the one or more coils at a predefined distance,
wherein, in the plan view, an entirety of the barrier is located outside of the one or more coils,
wherein, in the width direction, the barrier overlaps with each of the one or more coils located in the housing, and
wherein the barrier is spaced apart from the inner wall of the housing.

9. The filter unit of claim 8, wherein the filter unit further includes:
a low pass filter received in the housing; and
one or more notch filters connected to the low pass filter in series,
wherein the one or more coils are received in the low pass filter or the notch filter.

10. The filter unit of claim 9, wherein the barrier includes a non-magnetic material.

11. The filter unit of claim 10, wherein the barrier includes a dielectric material or is embodied as a floating wall.

12. The filter unit of claim 10, wherein the barrier of the filter unit adjusts a distance between the coil and the inner wall of the housing to control the frequency blocked by the filter unit.

* * * * *